(12) United States Patent
Han

(10) Patent No.: US 8,134,371 B2
(45) Date of Patent: Mar. 13, 2012

(54) SIGNAL GENERATING CIRCUIT FOR DETECTING GROUND STATUS

(76) Inventor: Jun Han, Guangdong (CN)

( * ) Notice: Subject to any disclaimer, the term of this patent is extended or adjusted under 35 U.S.C. 154(b) by 384 days.

(21) Appl. No.: 12/312,279

(22) PCT Filed: Oct. 17, 2007

(86) PCT No.: PCT/CN2007/002969
§ 371 (c)(1),
(2), (4) Date: Apr. 30, 2009

(87) PCT Pub. No.: WO2008/061432
PCT Pub. Date: May 29, 2008

(65) Prior Publication Data
US 2009/0315538 A1    Dec. 24, 2009

(30) Foreign Application Priority Data
Nov. 23, 2006 (CN) .......................... 2006 1 0157046

(51) Int. Cl.
*G01R 19/22* (2006.01)
*G01R 31/14* (2006.01)
*G01R 31/40* (2006.01)

(52) U.S. Cl. .................... 324/509; 324/119; 324/764.01
(58) Field of Classification Search .................. None
See application file for complete search history.

(56) References Cited

U.S. PATENT DOCUMENTS
2006/0202640 A1* 9/2006 Alexandrov ............... 315/291
* cited by examiner

*Primary Examiner* — Roberto Velez
(74) *Attorney, Agent, or Firm* — Raymond Y. Chan; David and Raymond Patent Firm

(57) ABSTRACT

A signal generating circuit for detecting ground status includes a power supply input unit (A), a step down rectified power supply or DC power supply unit (C) in series. The DC power supply required by a signal detection and process unit (D) is obtained by the power supply input unit (A) passing through the step down DC power supply unit (C), and then a ground status signal is obtained and outputted via a resistor unit (B) and the signal detection and process unit (D) connected in turn.

13 Claims, 6 Drawing Sheets

US 8,134,371 B2

SIGNAL GENERATING CIRCUIT FOR DETECTING GROUND STATUS

BACKGROUND OF THE PRESENT INVENTION

1. Field of Invention

The present invention relates to a signal generating circuit, and more particularly to a signal generating circuit for detecting ground status.

2. Description of Related Arts

Signal generating circuit is a common circuit and widely applied to electrical or electronic industry, wherein the signal generating circuit comprises a signal outputting circuit, and a step down rectifier circuit or DC power supply unit. When the power cable or the electrical equipment is not grounded or grounded in an improper way, there are significant safety risks to the human bodies and the equipments.

SUMMARY OF THE PRESENT INVENTION

An object of the present invention is to overcome the above drawbacks of the conventional technology, wherein the signal generating circuit for detecting ground status provides a security inspection for detecting its grounding status or detecting the grounding status of the power input cable or the electrical equipment.

Accordingly, in order to accomplish the above object, the present invention provides a signal generating circuit for detecting ground status.

The signal generating circuit comprises a power supply input unit A and a step down DC power supply unit C connected to the power supply input unit A. A power source is inputted into the power supply input unit A to pass through the step down DC power supply unit C to obtain a DC power source, which is for the need of a signal detection and process unit D, and then connecting to a resistor unit B and the signal detection and process unit D respectively to obtain and output a ground status signal.

The above object of the signal generating circuit for detecting ground status can further be achieved with the followings.

The resistor unit B comprises one or more resistors connected with each other in parallel or in series.

The resistor unit B comprises a resistor $R_A$, a resistor $R_B$, a resistor $R_C$, and a resistor $R_D$, wherein the resistor $R_A$ is connected to $R_B$ in series, wherein an input end of the resistors $R_A$, $R_B$ in series is connected to a hot wire (live wire) of the power supply input unit A, and an output end of the resistors $R_A$, $R_B$ in series is connected to an earth wire (ground wire) of the signal detection and process unit D. The resistors $R_C$, $R_D$ are connected in series, wherein an input end of the resistors $R_C$, $R_D$ in series is connected to a neutral wire (null line) of the power supply input unit A, and an output end of the resistors $R_C$, $R_D$ in series is connected to the ground wire of the signal detection and process unit D.

The resistor unit B comprises a resistor $R_A$, a resistor $R_B$, wherein the resistor $R_A$ is connected to $R_B$ in series, wherein an input end of the resistors $R_A$, $R_B$ in series is connected to a hot wire of the power supply input unit A, and an output end of the resistors $R_A$, $R_B$ in series is connected to a ground wire of the signal detection and process unit D.

The resistor unit B comprises a resistor $R_A$, a resistor $R_B$, a resistor $R_C$, and a resistor $R_D$, wherein the resistor $R_A$ is connected to $R_B$ in series, wherein an input end of the resistors $R_A$, $R_B$ in series is connected to a hot wire of the power supply input unit A, and an output end of the resistors $R_A$, $R_B$ in series is connected to an Vcc of the signal detection and process unit D. The resistors $R_C$, $R_D$ are connected in series, wherein an input end of the resistors $R_C$, $R_D$ in series is connected to the neutral wire of the power supply input unit A, and an output end of the resistors $R_C$, $R_D$ in series is connected to the Vcc of the signal detection and process unit D.

The resistor unit B comprises a resistor $R_A$, a resistor $R_B$, a resistor $R_C$, and a resistor $R_D$, wherein the resistor $R_A$ is connected to $R_B$ in series, wherein an input end of the resistors $R_A$, $R_B$ in series is connected to a hot wire of the power supply input unit A, and an output end of the resistors $R_A$, $R_B$ in series is connected to an Vcc of the signal detection and process unit D.

The signal detection and process unit D comprises a resistor $R_1$, a resistor $R_2$, a resistor $R_3$, a resistor $R_4$, a diode $D_5$, a diode $D_{15}$, a chip $U_1$, wherein a positive pole of the diode $D_{15}$ is connected to a ground wire of the chip $U_1$, and a negative pole of the diode $D_{15}$ is connected to a negative terminal (−) of the chip $U_1$. A voltage divider of the connected in series resistors $R_1$, $R_2$ is parallel connected to a voltage divider of the connected in series resistors $R_3$, $R_4$ and the diode $D_5$. A voltage divider connecting point 2 between the resistors $R_1$ and $R_2$ is connected to a position terminal (+) of the chip $U_1$, wherein the other end of the resistor $R_1$ is connected to a Vcc of the chip $U_1$, wherein the other end of the resistor $R_2$ is connected to a ground wire of the chip $U_1$. A voltage divider connecting point 3 of the resistors $R_3$, $R_4$, and the diode $D_5$ is connected to the negative terminal of the chip $U_1$, wherein one end of the resistor $R_4$ is connected to the Vcc of the chip $U_1$, and the other end of the resistor $R_4$ is connected to a positive pole of the diode $D_5$, wherein a negative pole of the diode $D_5$ is connected to the voltage divider connecting point 3. One end of the resistor $R_3$ is connected to the ground wire of the chip $U_1$, and the other end of the resistor $R_3$ is connected to the voltage divider connecting point 3. An output end of the resistor unit B is connected to the negative terminal of the chip $U_1$. A ground wire SGND of the power supply input unit A is connected to the negative terminal of the chip $U_1$, and an output signal is connected to an output end of the chip $U_1$.

The signal detection and process unit D comprises a resistor $R_1$, a resistor $R_2$, a resistor $R_3$, a resistor $R_4$, a diodes $D_5$, a voltage regulator diode (Zener diode) $ZD_1$, and a chip $U_1$, wherein a negative pole of the voltage regulator diode $ZD_1$ is connected to a Vcc of the chip $U_1$, and a positive pole of the voltage regulator diode $ZD_1$ is connected to a positive terminal of the chip $U_1$. A voltage divider of the connected in series resistors $R_1$, $R_2$ is parallel connected to a voltage divider of the connected in series resistors $R_3$, $R_4$ and the diode $D_5$. A voltage divider connecting point 2 between the resistors $R_1$ and $R_2$ is connected to a negative terminal of the chip $U_1$, wherein the other end of the resistor $R_1$ is connected to a Vcc of the chip $U_1$, wherein the other end of the resistor $R_1$ is connected to a ground wire of the chip $U_1$. A voltage divider connecting point 3 of the resistors $R_3$, $R_4$, and the diode $D_5$ is connected to the positive terminal of the chip $U_1$, wherein one end of the resistor $R_4$ is connected to the Vcc of the chip $U_1$, and the other end of the resistor $R_4$ is connected to a positive pole of the diode $D_5$, wherein a negative pole of the diode $D_5$ is connected to the voltage divider connecting point 3. One end of the resistor $R_3$ is connected to the ground wire of the chip $U_1$, and the other end of the resistor $R_3$ is connected to the voltage divider connecting point 3. An output end of the resistor unit B is connected to the Vcc of the chip $U_1$. A ground wire SGND of the power supply input unit A is connected to the positive terminal of the chip $U_1$, and an output signal is connected to an output end of the chip $U_1$.

The signal detection and process unit D comprises a resistor $R_1$, a resistor $R_2$, a resistor $R_3$, a diodes $D_1$, a diodes $D_2$, and a chip $U_1$, wherein one end of the resistor $R_1$ is connected to a ground wire SGND of the power supply input unit A, and the other end of the resistor $R_1$ is connected to one of the I/O pins of the chip $U_1$ through the connecting point 1 and 2 respectively. A voltage divider of the connected in series resistors $R_2$, $R_3$ is parallely connected to the connected in series diode $D_1$ and $D_2$, wherein the other end of the resistor $R_2$ and an positive pole of the diode $D_2$ are connected to a ground wire GND pin 4 of the chip $U_1$, and the other end of the resistor $R_3$ and a negative pole of the diode $D_1$ are connected to a power Vcc pin 8 of the chip $U_1$. An output end of the resistor unit B is connected to the ground wire GND pin 4 of the chip $U_1$.

The present invention has the following advantages in comparison with the conventional technology.

Applying the above signal generating circuit is simple in structure and practical. The signal generating circuit can effectively detect the importation of power cables or electrical equipment grounding status, so as to ensure the safety of human bodies and the operation of the equipments.

These and other objectives, features, and advantages of the present invention will become apparent from the following detailed description, the accompanying drawings, and the appended claims.

DETAILED DESCRIPTION OF THE PREFERRED EMBODIMENT

It will combine the accompany drawings to further describe the present invention as follows.

Figure 1:
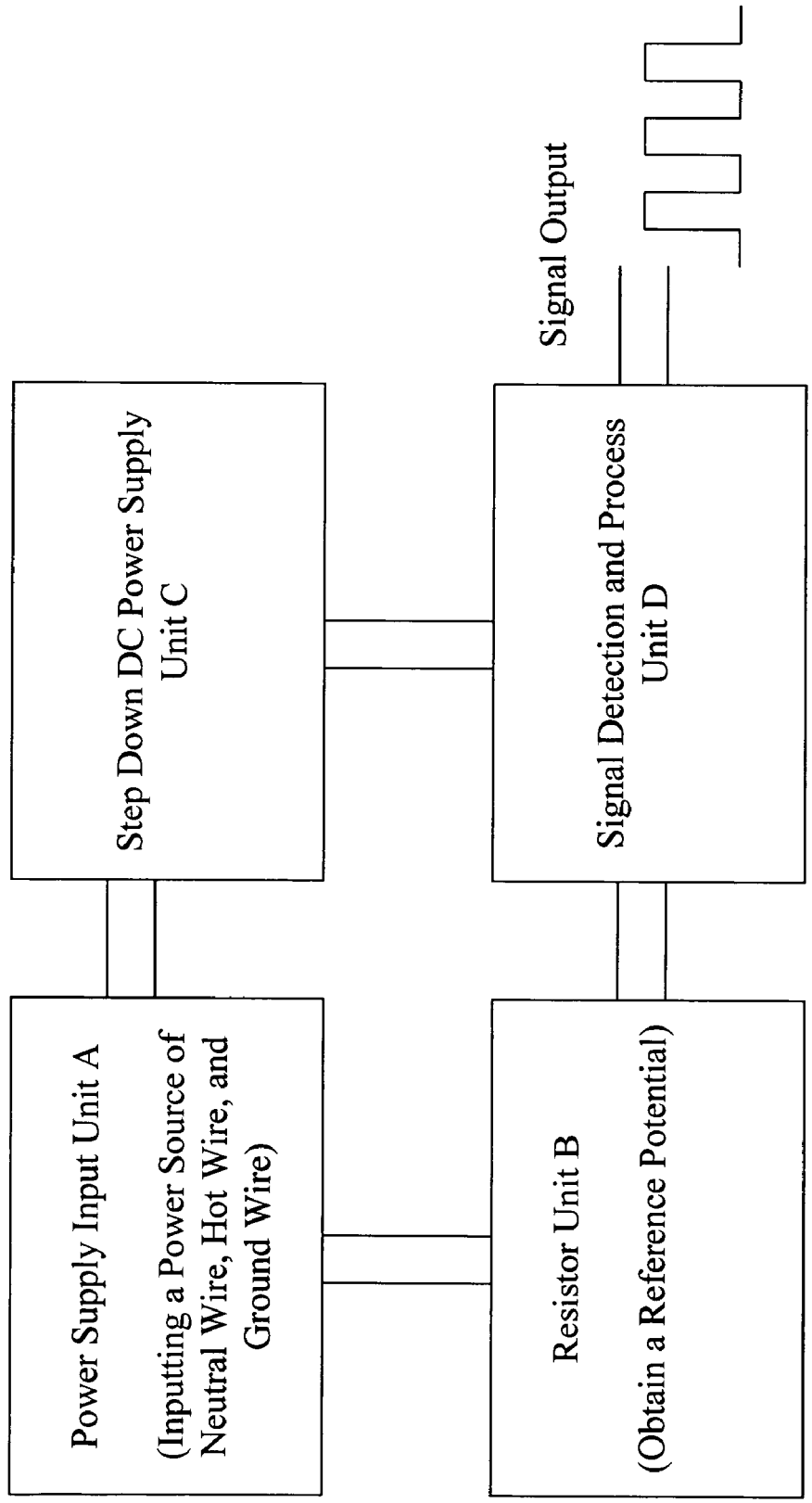
FIG. 1 is a block diagram of the signal generating circuit for detecting the ground status according to the present invention.
Figure 2:
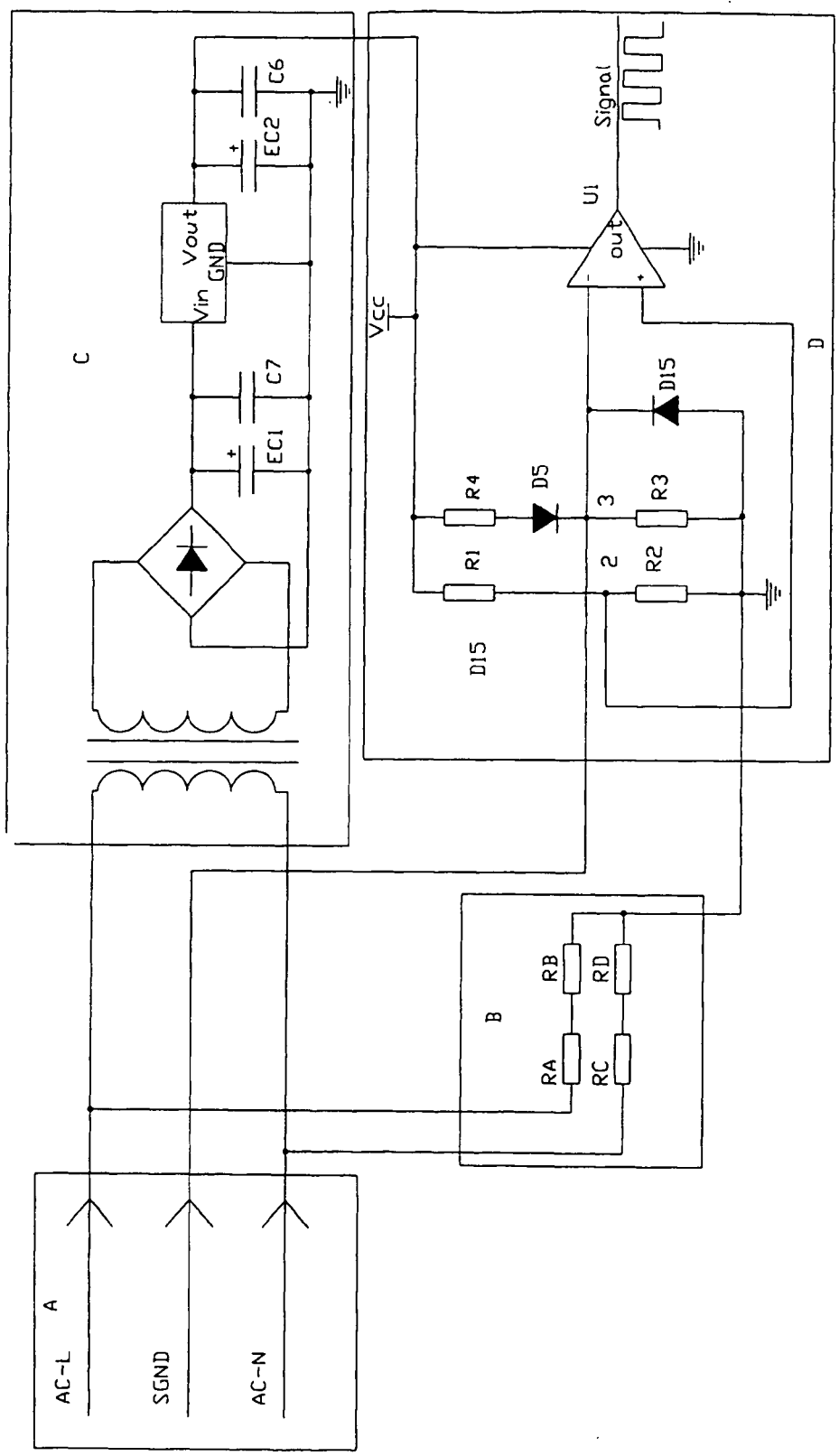
FIG. 2 is a schematic signal generating circuit for detecting the ground status according to a first preferred embodiment of the present invention.

Referring to FIGS. 1 and 2 of the drawings, a first preferred embodiment of the present invention is illustrated.

Referring to the accompany drawings, the signal generating circuit for detecting ground status comprises a power supply input unit A and a step down DC power supply unit C, wherein the power supply input unit A is connected to the step down DC power supply unit C, wherein a power source is inputted into the power supply input unit A to pass through the step down DC power supply unit C to obtain a DC power source, which is for the need of a signal detection and process unit D, and then connecting to a resistor unit B and the signal detection and process unit D respectively to obtain and output a ground status signal.

The resistor unit B comprises a resistor $R_A$, a resistor $R_B$, a resistor $R_C$, and a resistor $R_D$, wherein the resistor $R_A$ is connected to the resistor $R_B$ in series, wherein an input end of the resistors $R_A$, $R_B$ in series is connected to a hot wire of the power supply input unit A, and an output end of the resistors $R_A$, $R_B$ in series is connected to a ground wire of the signal detection and process unit D. The resistors $R_C$, $R_B$ are connected in series, wherein an input end of the resistors $R_C$, $R_D$ in series is connected to the neutral wire of the power supply input unit A, and an output end of the resistors $R_C$, $R_D$ in series is connected to the ground wire of the signal detection and process unit D.

The signal detection and process unit D comprises a resistor $R_1$, a resistor $R_2$, a resistor $R_3$, a resistor $R_4$, a diode $D_5$, a diode $D_{15}$, and a chip $U_1$, wherein a positive pole of the diode $D_{15}$ is connected to a ground wire of the chip $U_1$, and a negative pole of the diode $D_{15}$ is connected to a negative terminal of the chip $U_1$. A voltage divider of the connected in series resistors $R_1$, $R_2$ is parallel connected to a voltage divider of the connected in series resistors $R_3$, $R_4$ and the diode Ds. A voltage divider connecting point 2 between the resistors $R_1$ and $R_2$ is connected to a positive terminal of the chip $U_1$, wherein the other end of the resistor $R_1$ is connected to a Vcc of the chip $U_1$, wherein the other end of the resistor $R_2$ is connected to a ground wire of the chip $U_1$. A voltage divider connecting point 3 of the resistors $R_3$, $R_4$, and the diode $D_5$, which is located in between the resistor $R_3$ and the resistor $R_4$, diode $D_5$, is connected to the negative terminal of the chip $U_1$, wherein one end of the resistor $R_4$ is connected to the Vcc of the chip $U_1$, and the other end of the resistor $R_4$ is connected to a positive pole of the diode $D_5$, wherein a negative pole of the diode $D_5$ is connected to the voltage divider connecting point 3. One end of the resistor $R_3$ is connected to the ground wire of the chip $U_1$, and the other end of the resistor $R_3$ is connected to the voltage divider connecting point 3. An output end of the resistor unit B is connected to the negative terminal of the chip $U_1$. A ground wire SGND of the power supply input unit A is connected to the negative terminal of the chip $U_1$, and an output signal is connected to an output end of the chip $U_1$.

Figure 3:
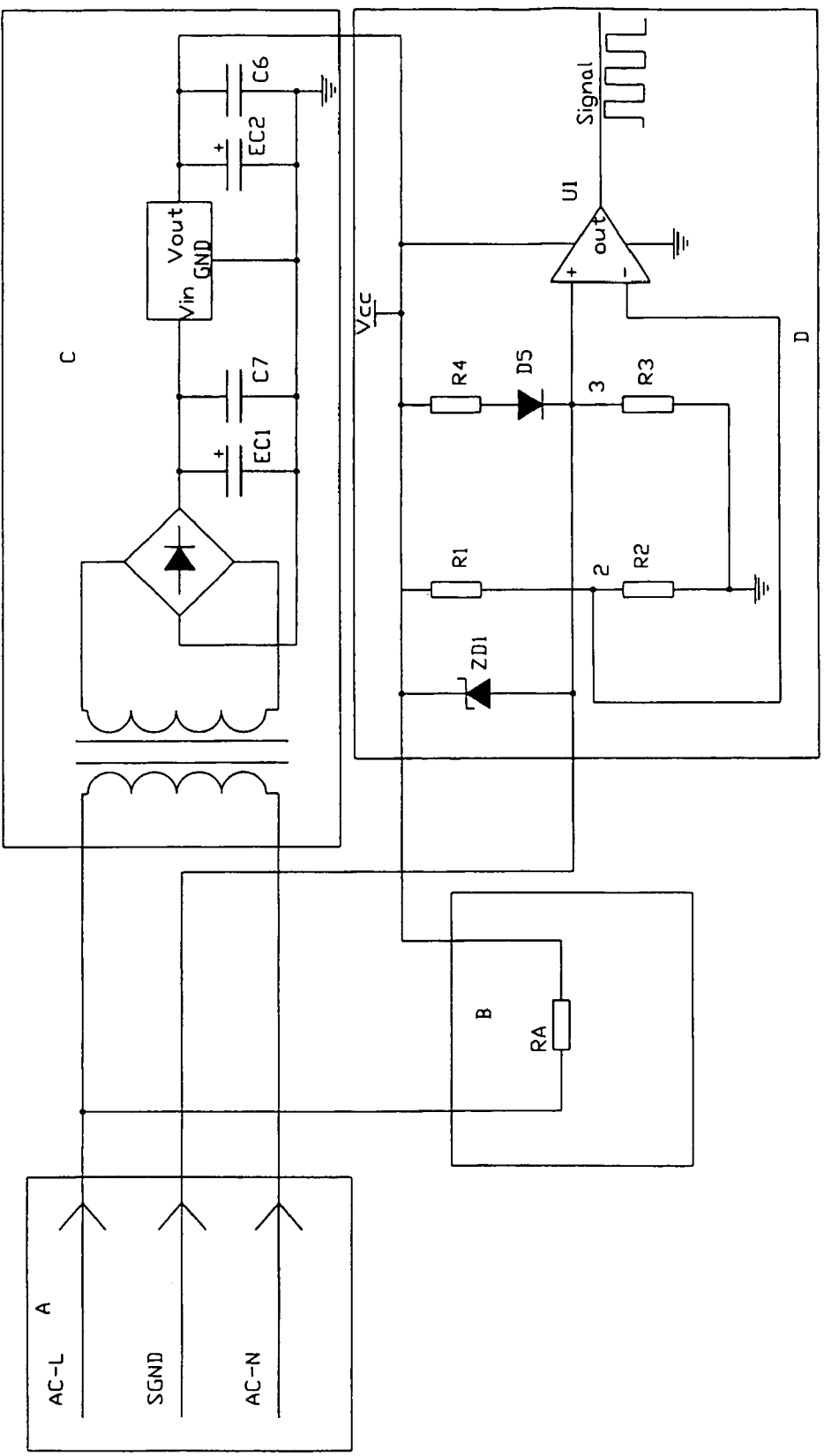
FIG. 3 is a schematic signal generating circuit for detecting the ground status according to a second preferred embodiment of the present invention.

Referring to FIGS. 1 and 3 of the drawings, a second preferred embodiment of the present invention is illustrated.

Referring to the accompany drawings, the signal generating circuit for detecting ground status comprises a power supply input unit A and a step down DC power supply unit C, wherein the power supply input unit A is connected to the step down DC power supply unit C, wherein a power source is inputted into the power supply input unit A to pass through the step down DC power supply unit C to obtain a DC power source, which is for the need of a signal detection and process unit D, and then connecting to a resistor unit B and the signal detection and process unit D respectively to obtain and output a ground status signal.

The resistor unit B comprises a resistor $R_A$, wherein an input end of the resistor unit B is connected to a hot wire of the power supply input unit A, and an output end of the resistor unit B is connected to a Vcc of the signal detection and process unit D.

The signal detection and process unit D comprises a resistor $R_1$, a resistor $R_2$, a resistor $R_3$, a resistor $R_4$, a diodes $D_5$, a voltage regulator diode $ZD_1$, and a chip $U_1$, wherein a negative pole of the voltage regulator diode $ZD_1$ is connected to a Vcc of the chip $U_1$, and a positive pole of the voltage regulator diode $ZD_1$ is connected to a positive terminal of the chip $U_1$. A voltage divider of the connected in series resistors $R_1$, $R_2$ is parallel connected to a voltage divider of the connected in series resistors $R_3$, $R_4$ and the diode $D_5$. A voltage divider connecting point 2 between the resistors $R_1$ and $R_2$ is connected to a negative terminal of the chip $U_1$, wherein the other end of the resistor $R_1$ is connected to the Vcc of the chip $U_1$, wherein the other end of the resistor $R_2$ is connected to a ground wire of the chip $U_1$. A voltage divider connecting point 3 of the resistors $R_3$, $R_4$, and the diode $D_5$ is connected to a positive terminal of the chip $U_1$, wherein one end of the resistor $R_4$ is connected to the Vcc of the chip $U_1$, and the other end of the resistor $R_4$ is connected to a positive pole of the diode $D_5$, wherein a negative pole of the diode $D_5$ is connected to the voltage divider connecting point 3. One end of the resistor $R_3$ is connected to the ground wire of the chip $U_1$, and the other end of the resistor $R_3$ is connected to the voltage divider connecting point 3. An output end of the resistor unit B is connected to the Vcc of the chip $U_1$. A ground wire SGND of the power supply input unit A is connected to the positive terminal of the chip $U_1$, and an output signal is connected to an output end of the chip $U_1$.

Figure 4:
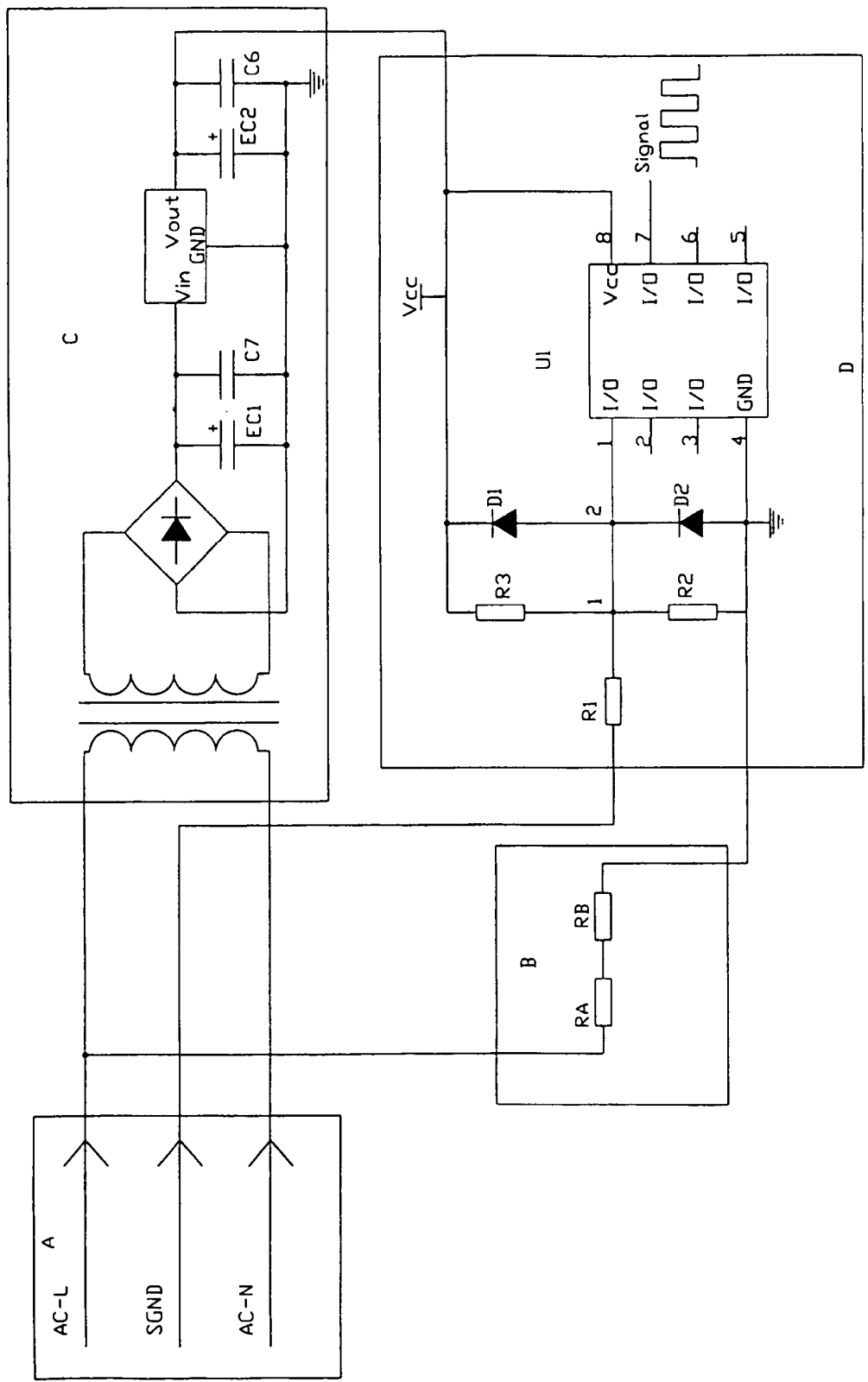
FIG. 4 is a schematic signal generating circuit for detecting the ground status according to a third preferred embodiment of the present invention.

Referring to FIGS. 1 and 4 of the drawings, a third preferred embodiment of the present is illustrated.

Referring to the accompany drawings, the signal generating circuit for detecting ground status comprises a power supply input unit A and a step down DC power supply unit C, wherein the power supply input unit A is connected to the step down DC power supply unit C, wherein a power source is inputted into the power supply input unit A to pass through the step down DC power supply unit C to obtain a DC power source, which is for the need of a signal detection and process unit D, and then connecting to a resistor unit B and the signal detection and process unit D respectively to obtain and output a ground status signal.

The resistor unit B comprises a resistor $R_A$ and a resistor $R_B$, wherein the resistors $R_A$, $R_B$ are connected in series, wherein an input end of the resistor unit B is connected to a hot wire of the power supply input unit A, and an output end of the resistor unit B is connected to a ground wire of the signal detection and process unit D.

The signal detection and process unit D comprises a resistor $R_1$, a resistor $R_2$, a resistor $R_3$, a diodes $D_1$, a diodes $D_2$, and a chip $U_1$, wherein one end of the resistor $R_1$ is connected to a ground wire SGND of the power supply input unit A, and the other end of the resistor $R_1$ is connected to one of the I/O pins of the chip $U_1$ through the voltage divider connecting point 1 and 2 respectively. A voltage divider of the connected in series resistors $R_2$, $R_3$ is parallely connected to the connected in series of the diode $D_1$ and the $D_2$, wherein the other end of the resistor $R_2$ and an positive pole of the diode $D_2$ are connected to a ground wire GND pin 4 of the chip $U_1$, and the other end of the resistor $R_3$ and a negative pole of the diode $D_1$ are connected to a power Vcc pin 8 of the chip $U_1$. An output end of the resistor unit B is connected to the ground wire GND pin 4 of the chip $U_1$.

Figure 5:
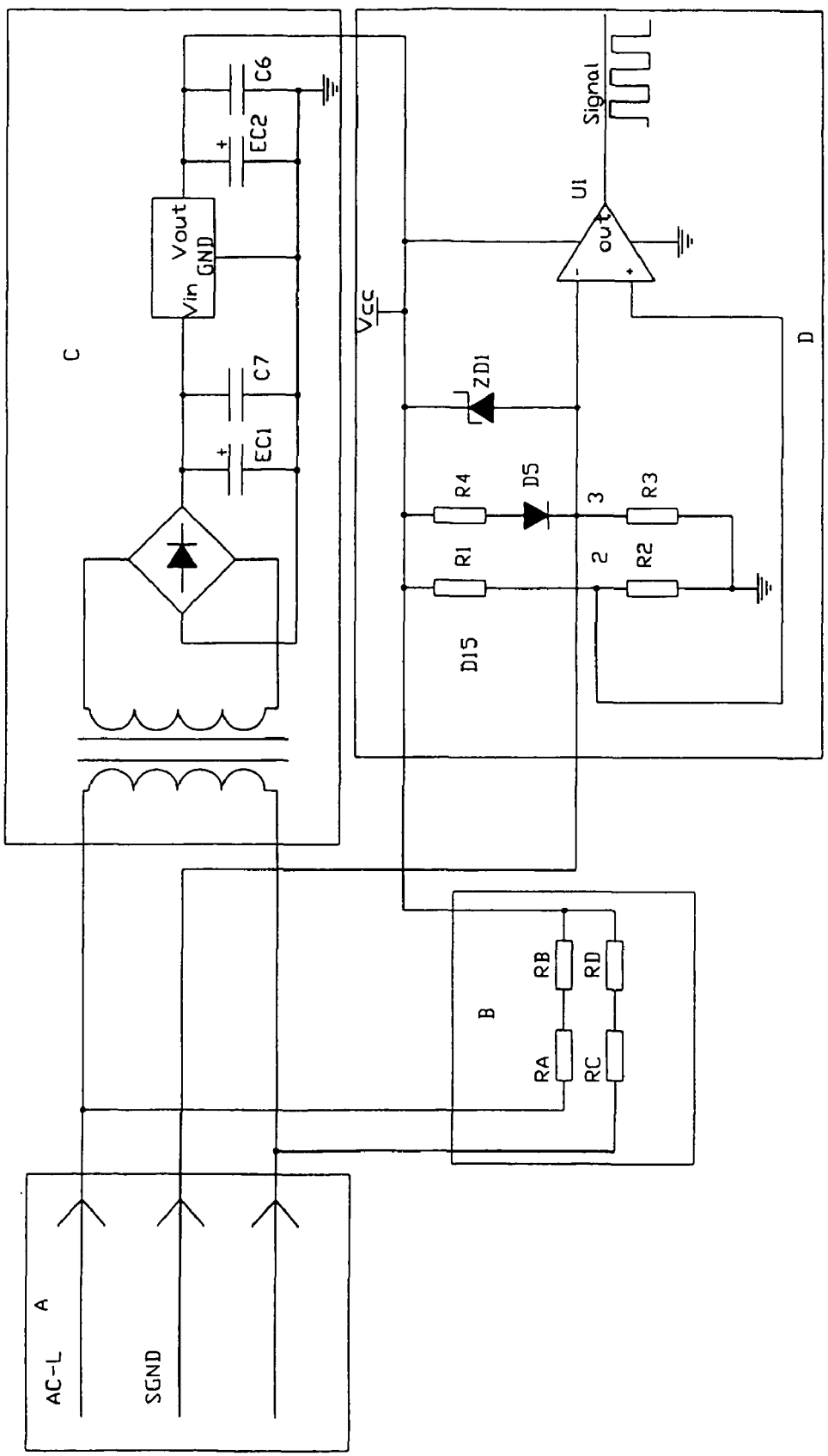
FIG. 5 is a schematic signal generating circuit for detecting the ground status according to a fourth preferred embodiment of the present invention.

Referring to FIGS. 1 and 5 of the drawings, a fifth preferred embodiment of the present invention is illustrated.

Referring to the accompany drawings, the signal generating circuit for detecting ground status comprises a power supply input unit A and a step down DC power supply unit C, wherein the power supply input unit A is connected to the step down DC power supply unit C, wherein a power source is inputted into the power supply input unit A to pass through the step down DC power supply unit C to obtain a DC power source, which is for the need of a signal detection and process unit D, and then connecting to a resistor unit B and the signal detection and process unit D respectively to obtain and output a ground status signal.

The resistor unit B comprises a resistor $R_A$, a resistor $R_B$, a resistor $R_C$, and a resistor $R_D$, wherein the resistor $R_A$ is connected to $R_B$ in series, wherein an input end of the resistors $R_A$, $R_B$ connected in series is connected to a hot wire of the power supply input unit A, and an output end of the resistors $R_A$, $R_B$ connected in series is connected to an Vcc of the signal detection and process unit D. The resistors $R_C$, $R_D$ are connected in series, wherein an input end of the resistors $R_C$, $R_D$ in series is connected to the neutral wire of the power supply input unit A, and an output end of the resistors $R_C$, $R_D$ in series is connected to the Vcc of the signal detection and process unit D.

The signal detection and process unit D comprises a resistor $R_1$, a resistor $R_2$, a resistor $R_3$, a resistor $R_4$, a diodes $D_5$, a voltage regulator diode $ZD_1$, and a chip $U_1$, wherein a negative pole of the voltage regulator diode $ZD_1$ is connected to a Vcc of the chip $U_1$, and a positive pole of the voltage regulator diode $ZD_1$ is connected to a negative terminal of the chip $U_1$. A voltage divider of the connected in series resistors $R_1$, $R_2$ is parallel connected to a voltage divider of the connected in series resistors $R_3$, $R_4$ and the diode $D_5$. A voltage divider connecting point 2 between the resistors $R_1$ and $R_2$ is connected to a positive terminal of the chip $U_1$, wherein the other end of the resistor $R_1$ is connected to a Vcc of the chip $U_1$, wherein the other end of the resistor $R_2$ is connected to a ground wire of the chip $U_1$. A voltage divider connecting point 3 of the resistors $R_3$, $R_4$, and the diode $D_5$ is connected to the negative terminal of the chip $U_1$, wherein one end of the resistor $R_4$ is connected to the Vcc of the chip $U_1$, and the other end of the resistor $R_4$ is connected to a positive pole of the diode $D_5$, wherein a negative pole of the diode $D_5$ is connected to the voltage divider connecting point 3. One end of the resistor $R_3$ is connected to the ground wire of the chip $U_1$, and the other end of the resistor $R_3$ is connected to the voltage divider connecting point 3. An output end of the resistor unit B is connected to the Vcc of the chip $U_1$. A ground wire SGND of the power supply input unit A is connected to the negative terminal of the chip $U_1$, and an output signal is connected to an output end of the chip $U_1$.

Figure 6:
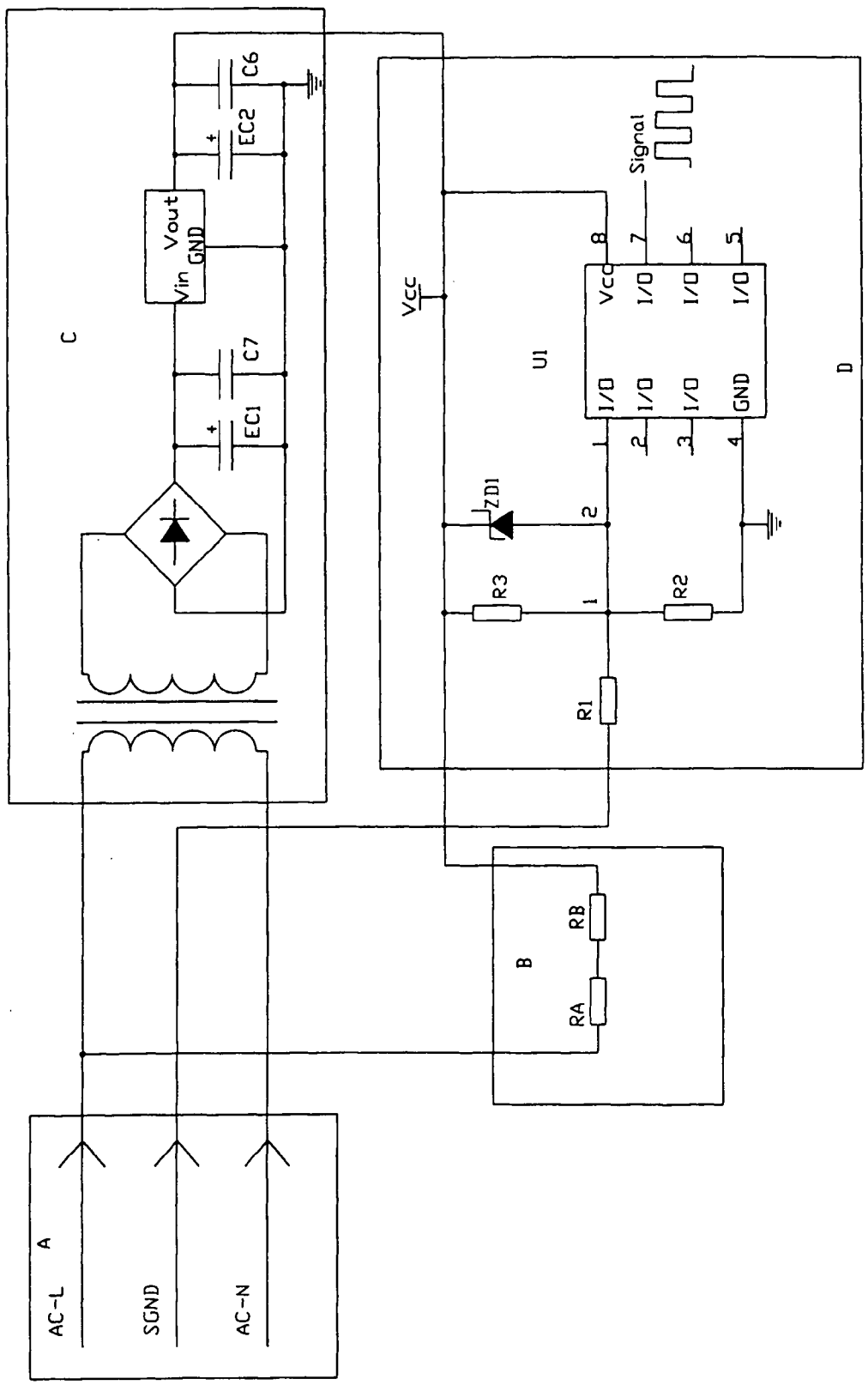
FIG. 6 is a schematic signal generating circuit for detecting the ground status according to a fifth preferred embodiment of the present invention.

Referring to FIGS. 1 and 6 of the drawings, a fifth preferred embodiment of the present invention is illustrated.

Referring to the accompany drawings, the signal generating circuit for detecting ground status comprises a power supply input unit A and a step down DC power supply unit C, wherein the power supply input unit A is connected to the step down DC power supply unit C, wherein a power source is inputted into the power supply input unit A to pass through the step down DC power supply unit C to obtain a DC power source, which is for the need of a signal detection and process unit D, and then connecting to a resistor unit B and the signal detection and process unit D respectively to obtain and output a ground status signal.

The resistor unit B comprises a resistor $R_A$ and a resistor $R_B$, wherein the resistors $R_A$, $R_B$ are connected in series, wherein an input end of the resistor unit B is connected to a hot wire of the power supply input unit A, and an output end of the resistor unit B is connected to a Vcc of the signal detection and process unit D.

The signal detection and process unit D comprises a resistor $R_1$, a resistor $R_2$, a resistor $R_3$, a voltage regulator diode $ZD_1$, and a chip $U_1$, wherein one end of the resistor $R_1$ is connected to a ground wire SGND of the power supply input unit A, and the other end of the resistor $R_1$ is connected to a I/O pin 1 of the chip $U_1$ through the connecting point 1 and 2 respectively. The voltage regulator diode $ZD_1$ is parallely connected to the resistor $R_3$, wherein a negative pole of the voltage regulator diode $ZD_1$ is connected to a power Vcc pin 8 of the chip $U_1$, and a positive pole of the voltage regulator diode $ZD_1$ is connected to a I/O pin 1 of the chip $U_1$. The resistor $R_2$ and the resistor $R_3$ are connected in series to form a voltage divider, wherein one end of the resistor $R_2$ is connected the voltage divider connecting point 1, and the other end of the $R_2$ is connected to a ground wire GND pin 4, and connected to the I/O pin 1 of the chip $U_1$.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A signal generating circuit for detecting ground status, comprising: a power supply unit A for being inputted a power source, wherein said power supply unit A comprises a neutral wire, a hot wire, and a ground wire; a resistor unit B provided to obtain a reference potential, wherein an input end of said resistor unit B is electrically connected to at least one of said neutral wire, and hot wire of said power supply unit A; a signal detection and process unit D, which comprises a signal detection circuit and a signal process circuit; and a step down DC power supply unit C connected to said power supply unit A, wherein said power source is inputted into said power supply unit A to pass through said step down DC power supply unit C to obtain a DC power source for said signal detection and process unit D, wherein said power supply unit C is further electrically connected to said resistor unit B and said signal detection and process unit D, so that said signal detection circuit of said signal detection and process unit D generates a ground status signal related to said reference potential of said resistor unit B, and said signal process circuit of said signal detection and process unit D outputs said ground status signal to show the ground status; wherein said resistor unit B comprises a plurality of resistors, wherein said resistors are connected to each other either in parallel or in series; wherein said resistor unit B comprises a resistor $R_A$, a resistor $R_B$, a resistor $R_C$, and a resistor $R_D$, wherein said resistor $R_A$ is connected to said resistor $R_B$ in series, and said resistor $R_C$ is connected to said resistor $R_D$ in series, wherein said resistors $R_A$, $R_B$ in series is parallely connected to said resistors $R_C$, $R_D$ in series.

2. The signal generating circuit for detecting ground status, as recited in claim 1, wherein an input end of said resistors $R_A$, RB connected in series is connected to said hot wire of said power supply input unit A, wherein an input end of said resistor $R_C$, $R_D$ connected in series is connected to said neutral wire of said power supply input unit A.

3. The signal generating circuit for detecting ground status, as recited in claim 2, wherein an output end of said resistors $R_A$, $R_B$ connected in series is connected to a ground wire of said signal detection and process unit D, wherein an output end of said resistor $R_C$, $R_D$ connected in series is connected to said ground wire of said signal detection and process unit D.

4. The signal generating circuit for detecting ground status, as recited in claim 3, wherein said signal detection and process unit D comprises a resistor $R_1$, a resistor $R_2$, a resistor $R_3$, a resistor $R_4$, a diode $D_5$, a diode $D_{15}$, and a chip $U_1$, wherein a positive pole of said diode $D_{15}$ is connected to a ground wire of said chip $U_1$, and a negative pole of said diode $D_{15}$ is connected to a negative terminal of said chip $U_1$, wherein a voltage divider of said connected in series resistors $R_1$, $R_2$ is parallel connected to a voltage divider of said connected in series resistors $R_3$, $R_4$ and said diode $D_5$, wherein a voltage divider connecting point 2 between said resistors $R_1$ and $R_2$ is connected to a positive terminal of said chip $U_1$, wherein the other end of said resistor $R_1$ is connected to a Vcc of said chip $U_1$, wherein the other end of said resistor $R_2$ is connected to a ground wire of said chip $U_1$, wherein a voltage divider connecting point 3 of said resistors $R_3$, $R_4$, and said diode $D_5$ is connected to said negative terminal of said chip $U_1$, wherein one end of said resistor $R_4$ is connected to said Vcc of said chip $U_1$, and the other end of said resistor $R_4$ is connected to a positive pole of said diode $D_5$, wherein a negative pole of said diode $D_5$ is connected to said voltage divider connecting point 3, wherein one end of said resistor $R_3$ is connected to said ground wire of said chip $U_1$, and the other end of said resistor $R_3$ is connected to said voltage divider connecting point 3, wherein an output end of said resistor unit B is connected to said negative terminal of said chip $U_1$, wherein a ground wire SGND of said power supply input unit A is connected to said negative terminal of said chip $U_1$, and an output signal is connected to an output end of said chip $U_1$.

5. The signal generating circuit for detecting ground status, as recited in claim 3, wherein said signal detection and process unit D comprises a resistor $R_1$, a resistor $R_2$, a resistor, a resistor, a diodes $D_5$, a voltage regulator diode $ZD_1$, and a chip $L_1$, wherein a negative pole of said voltage regulator diode $ZD_1$ is connected to a Vcc of said chip $U_1$, and a positive pole of said voltage regulator diode $ZD_1$ is connected to a positive terminal of said chip $U_1$, wherein a voltage divider of said connected in series resistors $R_1$, $R_2$ is parallel connected to a voltage divider of said connected in series resistors $R_3$, $R_4$ and said diode $D_5$, wherein a voltage divider connecting point 2 between said resistors $R_1$ and $R_2$ is connected to a negative terminal of said chip $U_1$, wherein the other end of said resistor $R_1$ is connected to a Vcc of said chip $U_1$, wherein the other end of said resistor $R_2$ is connected to a ground wire of said chip $U_1$, wherein a voltage divider connecting point 3 of said resistors $R_3$, $R_4$, and said diode $D_5$ is connected to said positive terminal of said chip $U_1$, wherein one end of said resistor $R_4$ is connected to said Vcc of said chip $U_1$, and the other end of said resistor $R_4$ is connected to a positive pole of said diode $D_5$, wherein a negative pole of said diode $D_5$ is connected to said voltage divider connecting point 3, wherein one end of said resistor $R_3$ is connected to said ground wire of said chip $U_1$, and the other end of said resistor $R_3$ is connected to said voltage divider connecting point 3, wherein an output end of said resistor unit B is connected to said Vcc of said chip $U_1$, wherein a ground wire SGND of said power supply input unit A is connected to said positive terminal of said chip $U_1$, and an output signal is connected to an output end of said chip $U_1$.

6. The signal generating circuit for detecting ground status, as recited in claim 3, wherein said signal detection and process unit D comprises a resistor $R_1$, a resistor $R_2$, a resistor $R_3$, a diodes $D_1$, a diodes $D_2$, and a chip $U_1$, wherein one end of said resistor $R_1$ is connected to a ground wire SGND of the power supply input unit A, and the other end of said resistor $R_1$ is connected to one of I/O pins of said chip $U_1$ through said voltage divider connecting point 1 and 2 respectively, wherein a voltage divider of said connected in series resistors $R_2$, $R_3$ is parallely connected to a connected in series of said diode $D_1$ and said diode $D_2$, wherein the other end of said resistor $R_2$ and an positive pole of said diode $D_2$ are connected to a ground wire GND pin 4 of said chip $U_1$, and the other end of the resistor $R_3$ and a negative pole of said diode $D_1$ are connected to a power Vcc pin 8 of said chip $U_1$, wherein an output end of said resistor unit B is connected to said ground wire GND pin 4 of said chip $U_1$.

7. The signal generating circuit for detecting ground status, as recited in claim 2, wherein an output end of said resistors $R_A$, $R_B$ connected in series is connected to a Vcc of said signal detection and process unit D, wherein an output end of said resistor $R_C$, $R_D$ connected in series is connected to said Vcc of said signal detection and process unit D.

8. The signal generating circuit for detecting ground status, as recited in claim 7, wherein said signal detection and process unit D comprises a resistor $R_1$, a resistor $R_2$, a resistor $R_3$, a resistor $R_4$, a diode $D_5$, a diode $D_{15}$, and a chip $U_1$, wherein a positive pole of said diode $D_{15}$ is connected to a ground wire of said chip $U_1$, and a negative pole of said diode $D_{15}$ is connected to a negative terminal of said chip $U_1$, wherein a voltage divider of said connected in series resistors $R_1$, $R_2$ is parallel connected to a voltage divider of said connected in series resistors $R_3$, $R_4$ and said diode $D_5$, wherein a voltage divider connecting point 2 between said resistors $R_1$ and $R_2$ is connected to a positive terminal of said chip $U_1$, wherein the other end of said resistor $R_1$ is connected to a Vcc of said chip $U_1$, wherein the other end of said resistor $R_2$ is connected to a ground wire of said chip $U_1$, wherein a voltage divider connecting point 3 of said resistors $R_3$, $R_4$, and said diode $D_5$ is connected to said negative terminal of said chip $U_1$, wherein one end of said resistor $R_4$ is connected to said Vcc of said chip $U_1$, and the other end of said resistor $R_4$ is connected to a positive pole of said diode $D_5$, wherein a negative pole of said diode $D_5$ is connected to said voltage divider connecting point 3, wherein one end of said resistor $R_3$ is connected to said ground wire of said chip $U_1$, and the other end of said resistor $R_3$ is connected to said voltage divider connecting point 3, wherein an output end of said resistor unit B is connected to said negative terminal of said chip $U_1$, wherein a ground wire SGND of said power supply input unit A is connected to said negative terminal of said chip $U_1$, and an output signal is connected to an output end of said chip $U_1$.

9. The signal generating circuit for detecting ground status, as recited in claim 7, wherein said signal detection and process unit D comprises a resistor $R_1$, a resistor $R_2$, a resistor $R_3$, a resistor $R_4$, a diodes $D_5$, a voltage regulator diode $ZD_1$, and a chip $U_1$, wherein a negative pole of said voltage regulator diode $ZD_1$ is connected to a Vcc of said chip $U_1$, and a positive pole of said voltage regulator diode $ZD_1$ is connected to a positive terminal of said chip $U_1$, wherein a voltage divider of said connected in series resistors $R_1$, $R_2$ is parallel connected to a voltage divider of said connected in series resistors $R_3$, $R_4$ and said diode $D_5$, wherein a voltage divider connecting point 2 between said resistors $R_1$ and $R_1$ is connected to a negative terminal of said chip $U_1$, wherein the other end of said resistor $R_1$ is connected to a Vcc of said chip $U_1$, wherein the other end of said resistor $R_2$ is connected to a ground wire of said chip $U_1$, wherein a voltage divider connecting point 3 of said resistors $R_3$, $R_4$, and said diode $D_5$ is connected to said positive terminal of said chip $U_1$, wherein one end of said resistor $R_4$ is connected to said Vcc of said chip $U_1$, and the other end of said resistor $R_4$ is connected to a positive pole of said diode $D_5$, wherein a negative pole of said diode $D_5$ is connected to said voltage divider connecting point 3, wherein one end of said resistor $R_3$ is connected to said ground wire of said chip $U_1$, and the other end of said resistor $R_3$ is connected to said voltage divider connecting point 3, wherein an output end of said resistor unit B is connected to said Vcc of said chip $U_1$, wherein a ground wire SGND of said power supply input unit A is connected to said positive terminal of said chip $U_1$, and an output signal is connected to an output end of said chip $U_1$.

10. The signal generating circuit for detecting ground status, as recited in claim 7, wherein said signal detection and process unit D comprises a resistor $R_1$, a resistor $R_2$, a resistor $R_3$, a diodes $D_1$, a diodes $D_2$, and a chip $U_1$, wherein one end of said resistor $R_1$ is connected to a ground wire SGND of the power supply input unit A, and the other end of said resistor $R_1$ is connected to one of I/O pins of said chip $U_1$ through said voltage divider connecting point 1 and 2 respectively, wherein a voltage divider of said connected in series resistors $R_2$, $R_3$ is parallely connected to a connected in series of said diode $D_1$ and said diode $D_2$, wherein the other end of said resistor $R_2$ and an positive pole of said diode $D_2$ are connected to a ground wire GND pin 4 of said chip $U_1$, and the other end of the resistor $R_3$ and a negative pole of said diode $D_1$ are connected to a power Vcc pin 8 of said chip $U_1$, wherein an output end of said resistor unit B is connected to said ground wire GND pin 4 of said chip $U_1$.

11. A signal generating circuit for detecting ground status, comprising: a power supply unit A for being inputted a power source, wherein said power supply unit A comprises a neutral wire, a hot wire, and a ground wire; a resistor unit B provided to obtain a reference potential, wherein an input end of said resistor unit B is electrically connected to at least one of said neutral wire, and hot wire of said power supply unit A; a signal detection and process unit D, which comprises a signal detection circuit and a signal process circuit; and a step down DC power supply unit C connected to said power supply unit A, wherein said power source is inputted into said power supply unit A to pass through said step down DC power supply unit C to obtain a DC power source for said signal detection and process unit D, wherein said power supply unit C is further electrically connected to said resistor unit B and said signal detection and process unit D, so that said signal detection circuit of said signal detection and process unit D generates a ground status signal related to said reference potential of said resistor unit B, and said signal process circuit of said signal detection and process unit D outputs said ground status signal to show the ground status; wherein said signal detection and process unit D comprises a resistor $R_1$, a resistor $R_2$, a resistor $R_3$, a resistor $R_4$, a diode $D_5$, a diode $D_{15}$, and a chip $U_1$, wherein a positive pole of said diode $D_{15}$ is connected to a ground wire of said chip $U_1$, and a negative pole of said diode $D_{15}$ is connected to a negative terminal of said chip $U_1$, wherein a voltage divider of said connected in series resistors $R_1$, $R_2$ is parallel connected to a voltage divider of said connected in series resistors $R_3$, $R_4$ and said diode $D_5$, wherein a voltage divider connecting point 2 between said resistors $R_1$ and $R_2$ is connected to a positive terminal of said chip $U_1$, wherein the other end of said resistor $R_1$ is connected to a Vcc of said chip $U_1$, wherein the other end of said resistor $R_2$ is connected to a ground wire of said chip $U_1$, wherein a voltage divider connecting point 3 of said resistors $R_3$, $R_4$, and said diode $D_5$ is connected to said negative terminal of said chip $U_1$, wherein one end of said resistor $R_4$ is connected to said Vcc of said chip $U_1$, and the other end of said resistor $R_4$ is connected to a positive pole of said diode $D_5$, wherein a negative pole of said diode $D_5$ is connected to said voltage divider connecting point 3, wherein one end of said resistor $R_3$ is connected to said ground wire of said chip $U_1$, and the other end of said resistor $R_3$ is connected to said voltage divider connecting point 3, wherein an output end of said resistor unit B is connected to said negative terminal of said chip $U_1$, wherein a ground wire SGND of said power supply input unit A is connected to said negative terminal of said chip $U_1$, and an output signal is connected to an output end of said chip $U_1$.

12. A signal generating circuit for detecting ground status, comprising: a power supply unit A for being inputted a power source, wherein said power supply unit A comprises a neutral wire, a hot wire, and a ground wire; a resistor unit B provided to obtain a reference potential, wherein an input end of said resistor unit B is electrically connected to at least one of said neutral wire, and hot wire of said power supply unit A; a signal detection and process unit D, which comprises a signal detection circuit and a signal process circuit; and a step down DC power supply unit C connected to said power supply unit A, wherein said power source is inputted into said power supply unit A to pass through said step down DC power supply unit C to obtain a DC power source for said signal detection and process unit D, wherein said power supply unit C is further electrically connected to said resistor unit B and said signal detection and process unit D, so that said signal detection circuit of said signal detection and process unit D generates a ground status signal related to said reference potential of said resistor unit B, and said signal process circuit of said signal detection and process unit D outputs said ground status signal to show the ground status; wherein said signal detection and process unit D comprises a resistor $R_1$, a resistor $R_2$, a resistor, a resistor, a diodes $D_5$, a voltage regulator diode $ZD_1$, and a chip $L_1$, wherein a negative pole of said voltage regulator diode $ZD_1$ is connected to a Vcc of said chip $U_1$, and a positive pole of said voltage regulator diode $ZD_1$ is connected to a positive terminal of said chip $U_1$, wherein a voltage divider of said connected in series resistors $R_1$, $R_2$ is parallel connected to a voltage divider of said connected in series resistors $R_3$, $R_4$ and said diode $D_5$, wherein a voltage divider connecting point 2 between said resistors $R_1$ and $R_2$ is connected to a negative terminal of said chip $U_1$, wherein the other end of said resistor $R_1$ is connected to a Vcc of said chip $U_1$, wherein the other end of said resistor $R_2$ is connected to a ground wire of said chip $U_1$, wherein a voltage divider connecting point 3 of said resistors $R_3$, $R_4$, and said diode $D_5$ is connected to said positive terminal of said chip $U_1$, wherein one end of said resistor $R_4$ is connected to said Vcc of said chip $U_1$, and the other end of said resistor $R_4$ is connected to a positive pole of said diode $D_5$, wherein a negative pole of said diode $D_5$ is connected to said voltage divider connecting point 3, wherein one end of said resistor $R_3$ is connected to said ground wire of said chip $U_1$, and the other end of said resistor $R_3$ is connected to said voltage divider connecting point 3, wherein an output end of said resistor unit B is connected to said Vcc of said chip $U_1$, wherein a ground wire SGND of said power supply input unit A is connected to said positive terminal of said chip $U_1$, and an output signal is connected to an output end of said chip $U_1$.

13. A signal generating circuit for detecting ground status, comprising: a power supply unit A for being inputted a power source, wherein said power supply unit A comprises a neutral wire, a hot wire, and a ground wire; a resistor unit B provided to obtain a reference potential, wherein an input end of said resistor unit B is electrically connected to at least one of said neutral wire, and hot wire of said power supply unit A; a signal detection and process unit D, which comprises a signal detection circuit and a signal process circuit; and a step down DC power supply unit C connected to said power supply unit A, wherein said power source is inputted into said power supply unit A to pass through said step down DC power supply unit C to obtain a DC power source for said signal detection and process unit D, wherein said power supply unit C is further electrically connected to said resistor unit B and said signal detection and process unit D, so that said signal detection circuit of said signal detection and process unit D generates a ground status signal related to said reference potential of said resistor unit B, and said signal process circuit of said signal detection and process unit D outputs said ground status signal to show the ground status; wherein said signal detection and process unit D comprises a resistor $R_1$, a resistor $R_2$, a resistor $R_3$, a diodes $D_1$, a diodes $D_2$, and a chip $U_1$, wherein one end of said resistor $R_1$ is connected to a ground wire SGND of the power supply input unit A, and the other end of said resistor $R_1$ is connected to one of I/O pins of said chip $U_1$ through said voltage divider connecting point 1 and 2 respectively, wherein a voltage divider of said connected in series resistors $R_2$, $R_3$ is parally connected to a connected in series of said diode $D_1$ and said diode $D_2$, wherein the other end of said resistor $R_2$ and an positive pole of said diode $D_2$ are connected to a ground wire GND pin 4 of said chip $U_1$, and the other end of the resistor $R_3$ and a negative pole of said diode $D_1$ are connected to a power Vcc pin 8 of said chip $U_1$, wherein an output end of said resistor unit B is connected to said ground wire GND pin 4 of said chip $U_1$.

* * * * *